United States Patent [19]

Tsai et al.

[11] Patent Number: 5,757,045
[45] Date of Patent: May 26, 1998

[54] CMOS DEVICE STRUCTURE WITH REDUCED RISK OF SALICIDE BRIDGING AND REDUCED RESISTANCE VIA USE OF A ULTRA SHALLOW, JUNCTION EXTENSION, ION IMPLANTATION

[75] Inventors: Chaochieh Tsai, Taichung; Shun-Liang Hsu, Hsin-chu, both of Taiwan

[73] Assignee: Taiwan Semiconductor Manufacturing Company Ltd., Hsin-Chu, Taiwan

[21] Appl. No.: 822,672

[22] Filed: Mar. 24, 1997

Related U.S. Application Data

[62] Division of Ser. No. 682,490, Jul. 17, 1996, Pat. No. 5,668,024.

[51] Int. Cl.[6] .................. H01L 29/78; H01L 27/092
[52] U.S. Cl. .................. 257/336; 257/344; 257/345; 257/371; 257/384; 257/413; 257/900
[58] Field of Search ............... 257/344, 345, 257/384, 336, 900

[56] References Cited

U.S. PATENT DOCUMENTS

| 4,597,824 | 7/1986 | Shinada et al. | 257/336 |
|---|---|---|---|
| 4,729,001 | 3/1988 | Haskell | 257/345 |
| 4,735,680 | 4/1988 | Yen | 257/384 |
| 4,912,061 | 3/1990 | Nasr | 437/44 |
| 4,935,379 | 6/1990 | Toyoshima | 257/344 |
| 5,439,839 | 8/1995 | Jang | 437/44 |
| 5,449,937 | 9/1995 | Arimura et al. | 257/336 |
| 5,532,508 | 7/1996 | Kaneko et al. | 257/344 |
| 5,675,166 | 10/1997 | Ilderem et al. | 257/345 |
| 5,712,503 | 1/1998 | Kim et al. | 257/344 |

*Primary Examiner*—Gene M. Munson
*Attorney, Agent, or Firm*—George O. Saile; Stephen B. Ackerman

[57] ABSTRACT

A method for forming a CMOS device, with improved yield, performance and reliability characteristics, has been developed. Yield improvements have been addressed by the use of a dual insulator spacer, used to reduce the risk of salicide bridging, as well as the use of pocket implantation regions, used to reduce punchthrough leakage. An ultra shallow junction extension region has been created in a peripheral channel region, reducing the resistance of this region, thus enhancing the performance of the CMOS device. In addition, ultra lightly doped source and drain regions are used to relax reliability concerns, regarding hot electron injection.

7 Claims, 7 Drawing Sheets

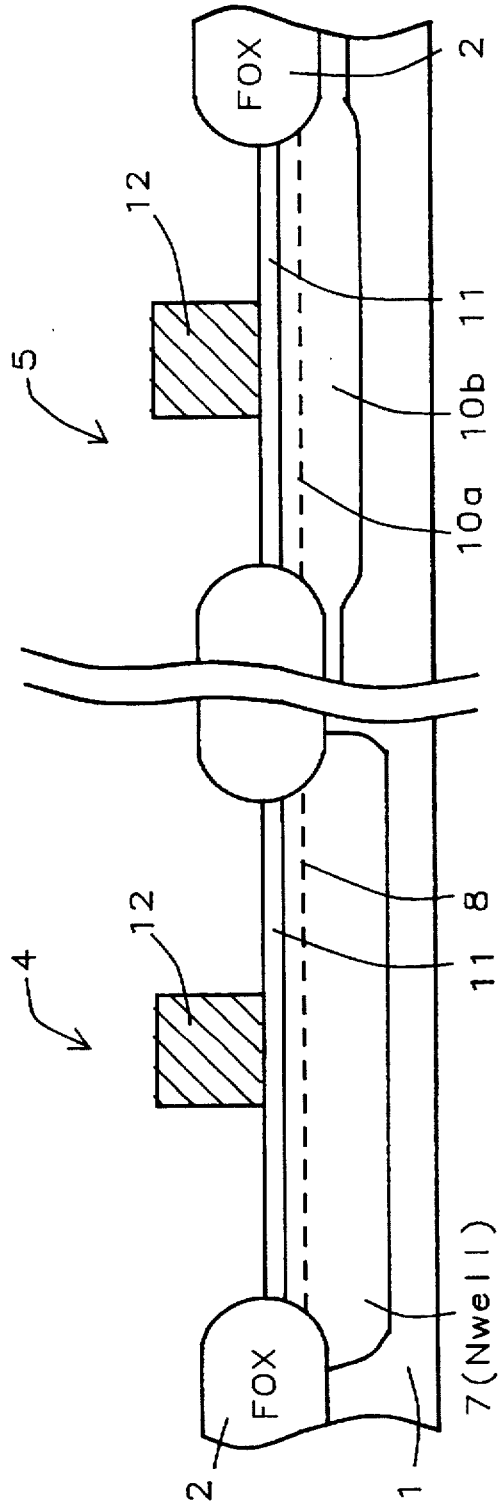
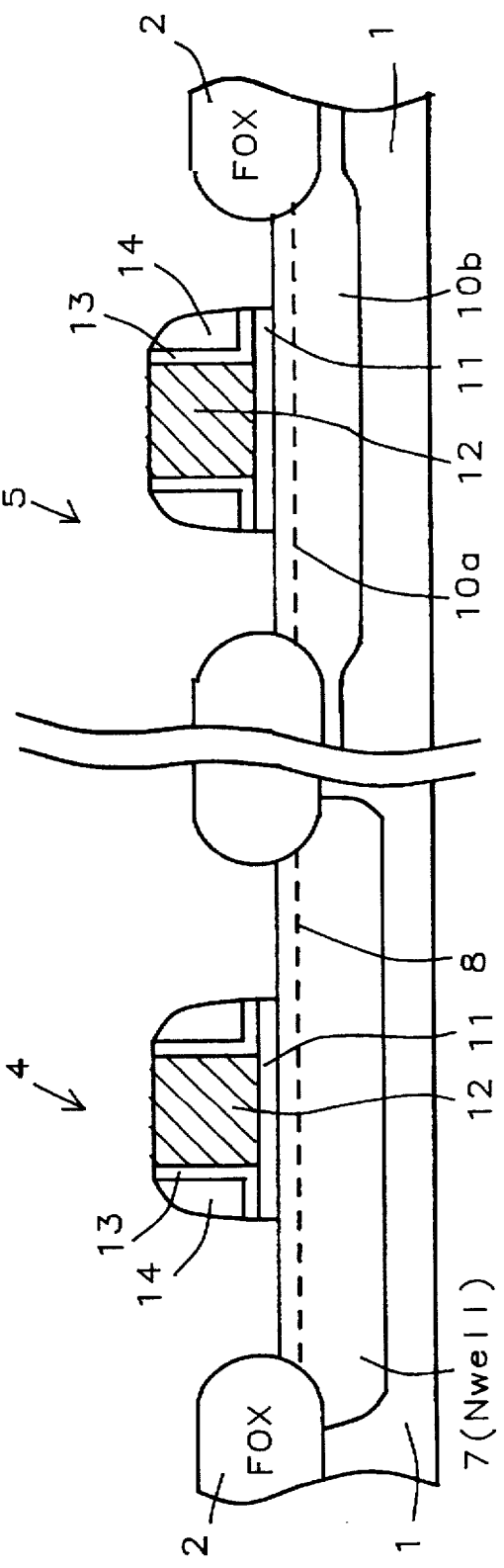

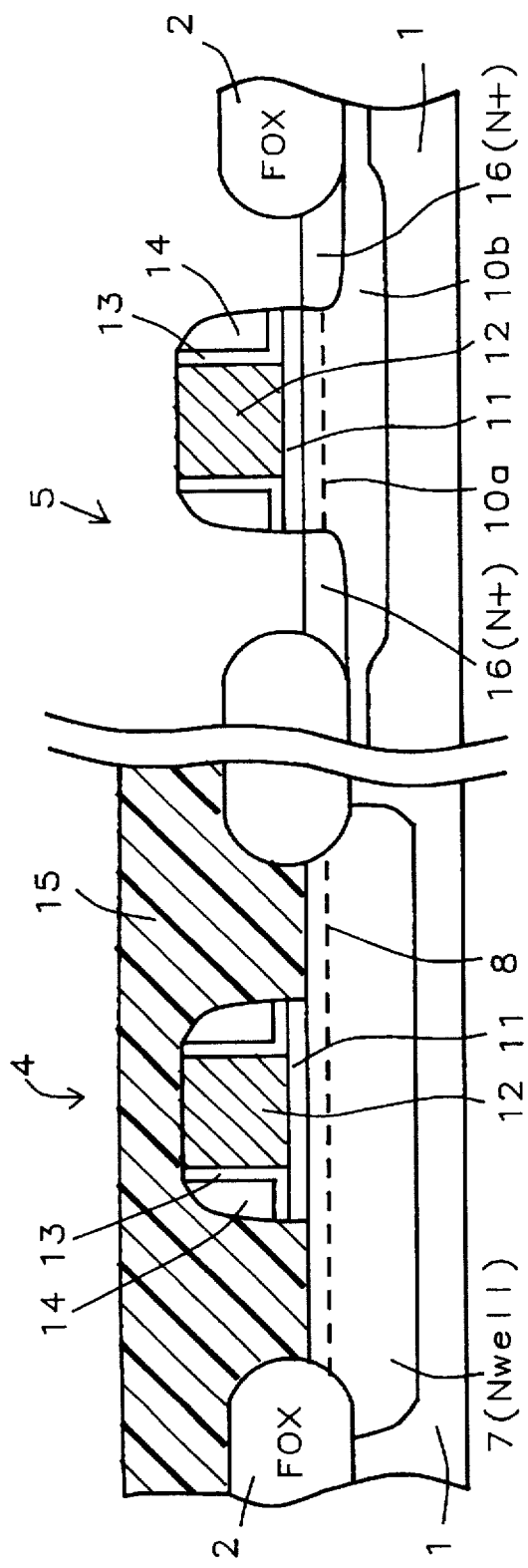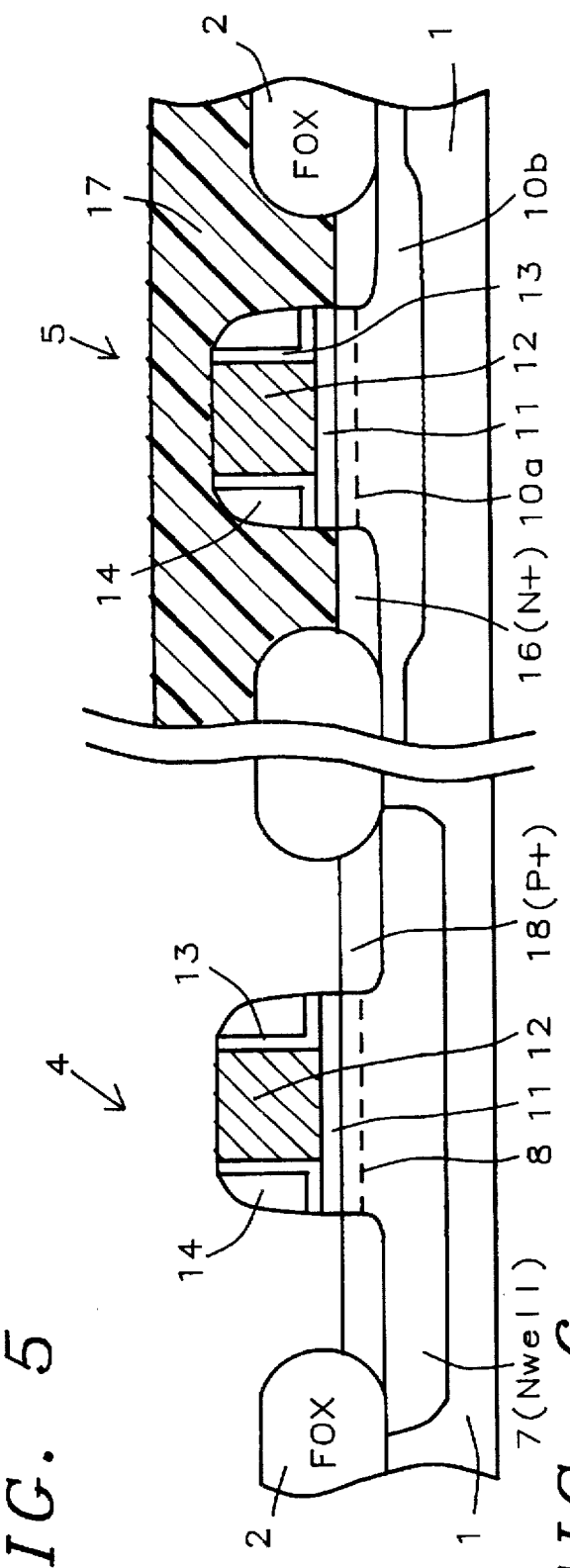

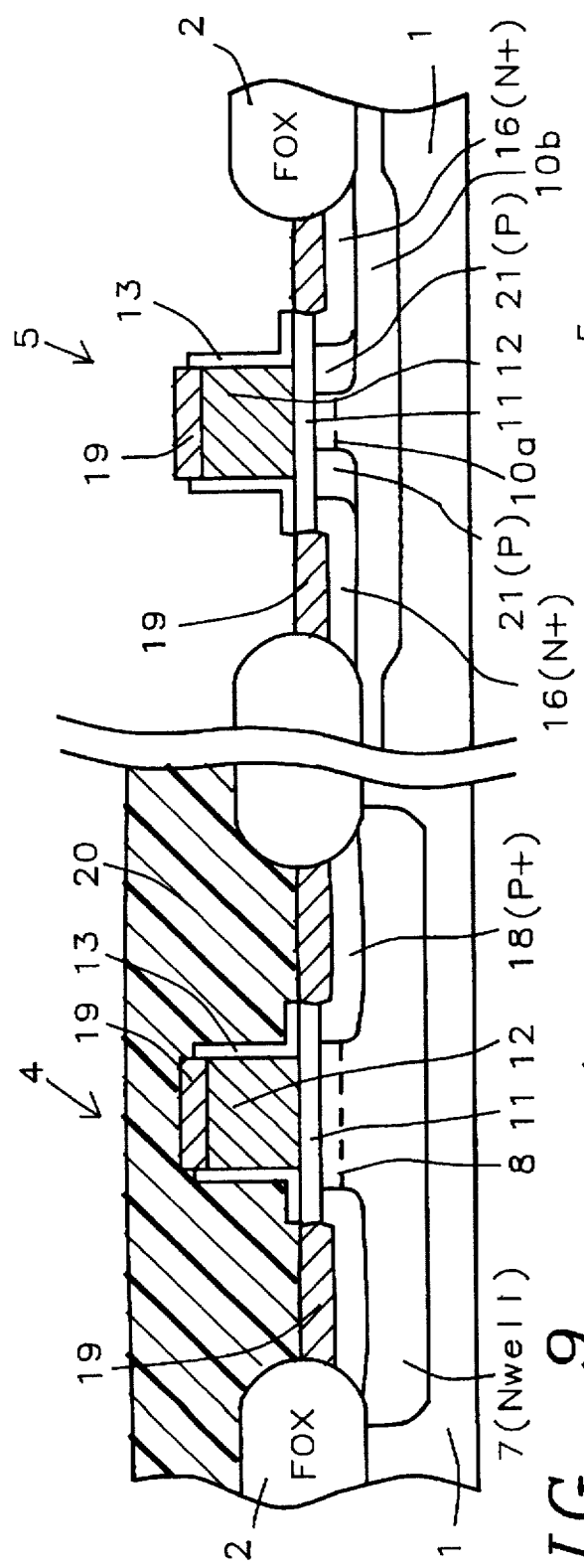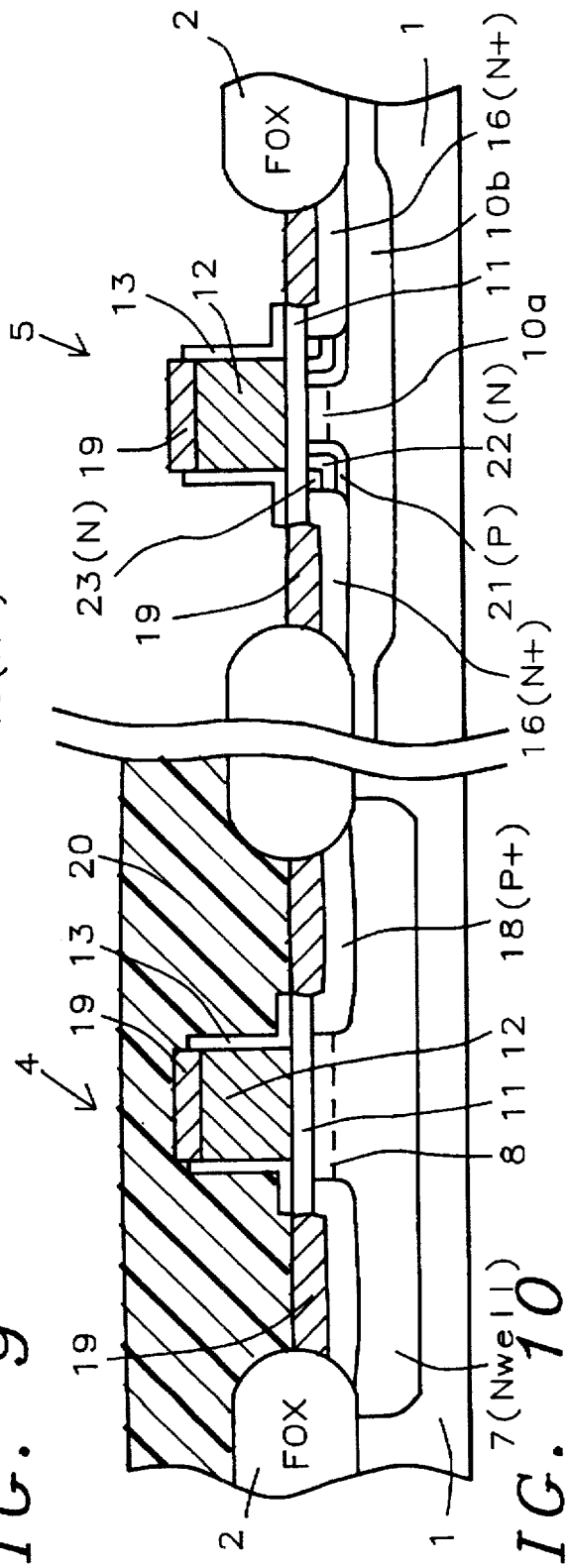

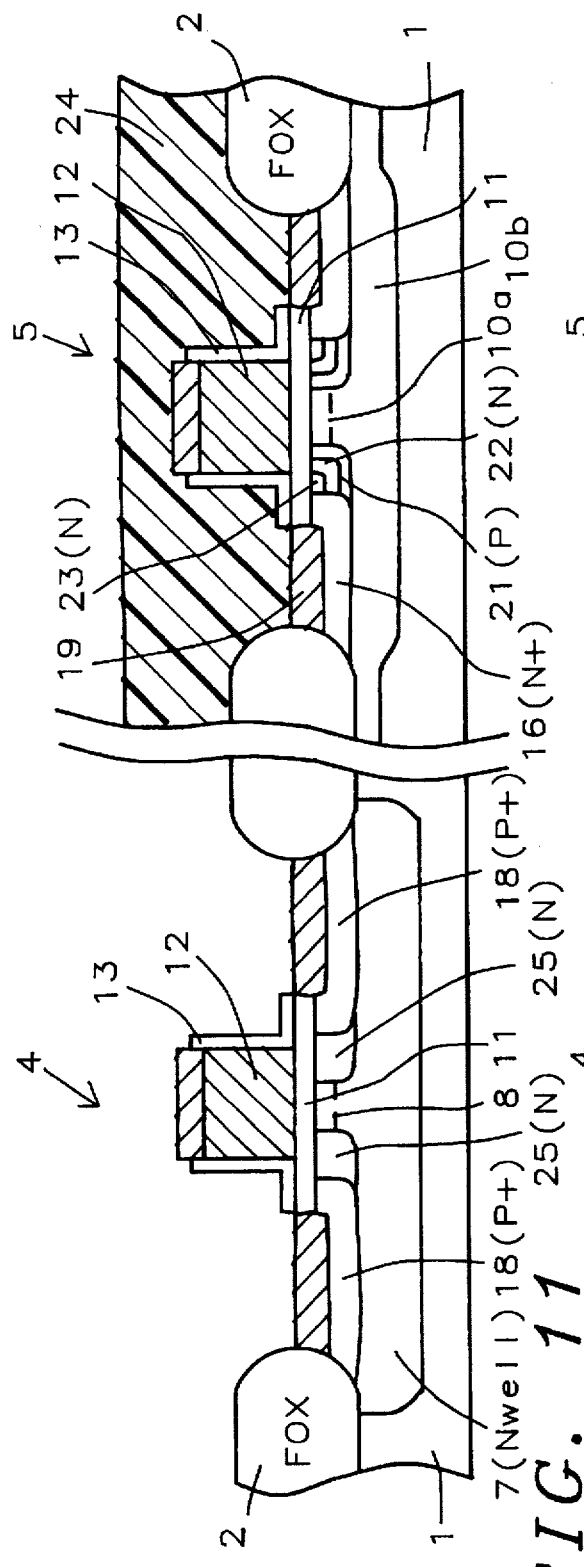
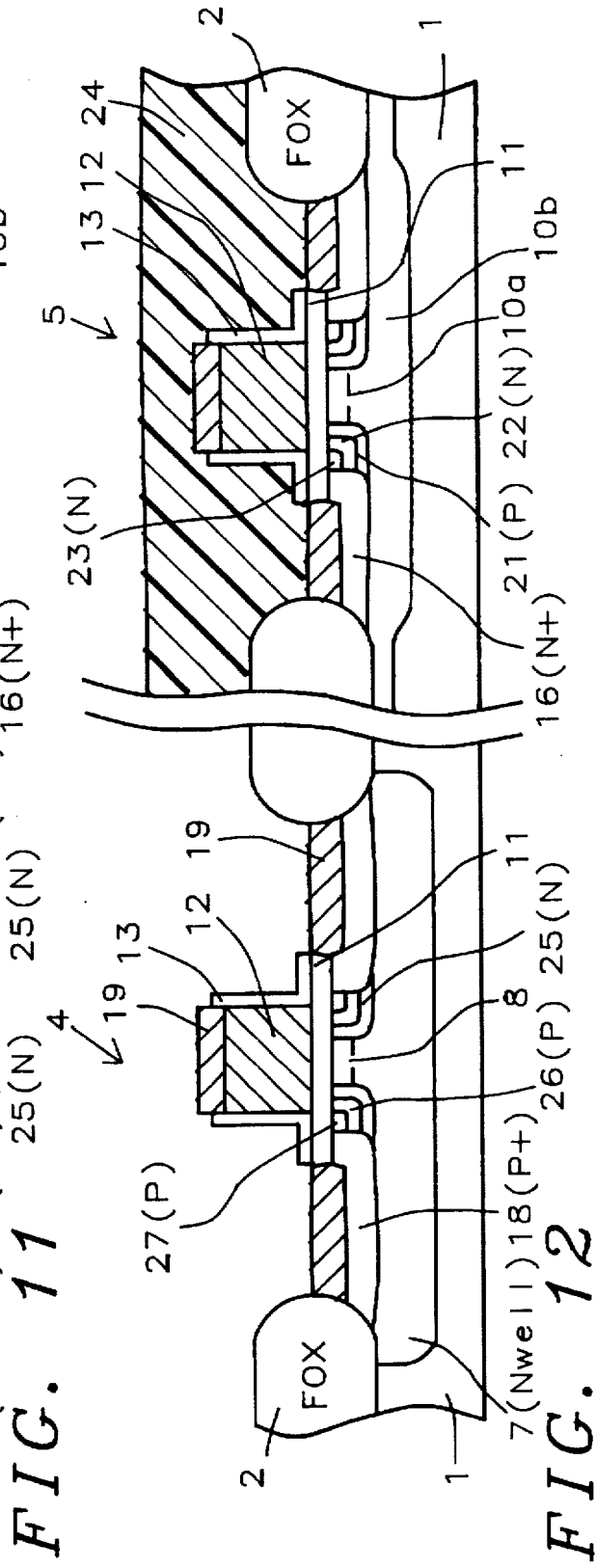
FIG. 11
FIG. 12

CM OS DEVICE STRUCTURE WITH REDUCED RISK OF SALICIDE BRIDGING AND REDUCED RESISTANCE VIA USE OF A ULTRA SHALLOW, JUNCTION EXTENSION, ION IMPLANTATION

This application, Ser. No. 08/682,490, is a divisional application of parent application, filed Jul. 17, 1996, which has been issued as a patent, U.S. Pat. No. 5,668,024.

BACKGROUND OF THE INVENTION

(1) Field of the Invention

The present invention relates to a process in which complimentary metal oxide semiconductor, (CMOS), field effect transistors, are fabricated, with specific process steps included to improve CMOS performance while reducing the risk of yield and reliability failures.

(2) Description of Prior Art

Very large scale integration, (VLSI), has allowed the semiconductor chip industry to increase circuit density while still maintaining, or reducing cost. This has been accomplished by ability of the semiconductor industry to fabricate silicon devices with sub-micron features, or microminiaturazation. The attainment of sub-micron features has been achieved mainly by advances in specific semiconductor fabrication disciplines, such as photolithography and reactive ion etching, (RIE). The use of more sophisticated exposure cameras, as well as the development of more sensitive photoresist materials, have allowed sub-micron images in photoresist to be routinely obtained. Similar advances in dry etching tools and processes have resulted in the successful transfer of these sub-micron images in photoresist, to underlying materials, used for the fabrication of advanced CMOS devices.

However with the trend to smaller devices, specific yield and performance detractors, as well as reliability risks, become more prevalent. For example as the gate insulator of a CMOS device becomes thinner, in an attempt to improve device performance, the possibility of yield loss, due to insulator breakdown becomes greater. In addition as the channel length of the CMOS device becomes shorter, again to improve performance, the reliability risk of hot electron injection increase. Narrower channel lengths also present yield problems in terms of junction punchthrough. As the channel length of a CMOS device shortens, the space between depletion regions, created from the source region and the substrate, and from the drain region and substrate, decrease this close proximity, or touching of depletion regions, can result in punchthrough leakages, or yield detractors. In addition salicide, (Self-Aligned silICIDE), bridging, or the inability to completely separate the silicide formed on the source and drain regions, from the salicide formed on the gate structure of a CMOS device, can also result in yield loss.

Several solutions for these phenomena, occurring with narrow channel length CMOS devices, have been previously described. For example Jang, in U.S. Pat. No. 5,439,839, as well as Nasr, in U.S. Pat. No. 4,912,061, have described processes in which salicide bridging is addressed via use of a disposable sidewall spacer. However this invention will describe a CMOS process that will offer yield enhancements, regarding decreased salicide bridging, via use of a disposable sidewall spacer, formed via use of a dual insulator spacer structure. However in this invention the removal of part of the dual insulator spacer exposes a peripheral channel region, in which a pocket ion implantation procedure, used to reduce source and drain punchthrough leakage, is performed. In addition the incorporation of an ultra shallow ion implantation region, used to decrease the resistance between the silicide on the source and drain region, and the channel region, is also included in the peripheral channel region. These process steps enable sub-quarter micron CMOS devices, with enhanced yield and performance to be realized.

SUMMARY OF THE INVENTION

It is an object of this invention to provide a process for manufacturing a sub-quarter micron channel length, CMOS device, that will offer specific process steps used to improve yield, performance and reliability.

It is another object of this invention to use a dual insulator sidewall spacer, with the removal of the overlying insulator layer of the dual sidewall insulator spacer, performed after salicide formation, to reduce the risk of salicide bridging.

It is still another object of this invention to use a pocket ion implantation procedure, performed in a peripheral channel region, between a polysilicon gate structure and a heavily doped source and drain region, to reduce the risk of punchthrough leakage created by the close proximity of the depletion regions, formed from source and drain and substrate regions.

It is yet another object of this invention to perform an ultra shallow, ion implantation, junction extension procedure, in the peripheral channel region, to improve the performance of the sub-quarter micron CMOS device by reducing the resistance of this region.

In accordance with the present invention a method is described for fabricating a CMOS device in which yield, reliability and performance are improved via use specific process steps and sequences, such as the use of a dual insulator sidewall spacer, the use of a pocket ion implantation procedure, and the use of an ultra shallow junction extension procedure. After the formation of field oxide regions, an N well region is formed, via ion implantation procedures, in areas not covered by field oxide, with the N well region used for only the P channel, (PFET), devices of the CMOS device. Ion implantation processing is then performed for purposes of adjusting the threshold voltage of the ensuing PFET devices, followed by a photolithographic and ion implantation procedure, used to adjust the threshold voltage of the ensuing N channel, (NFET), devices. After the formation of a thin gate insulator, a polysilicon layer, is deposited, and patterned to create a polysilicon gate structure via use of photolithographic and reactive ion etching procedures. A dual insulator layer is next deposited consisting of an underlying layer of plasma enhanced chemical vapor deposited, (PECVD), silicon oxide, and an overlying layer of chemically vapor deposited titanium nitride. Anisotropic reactive ion etching results in the creation of the dual insulator spacer, on the sidewalls of the polysilicon gate structure. Photoresist masking is next performed to allow for the creation of the heavily doped source and drain regions for the NFET devices, via ion implantation procedures, followed by another photoresist blockout procedure, and ion implantation procedure, used to allow for the creation of heavily doped source and drain regions for the subsequent PFET devices. After photoresist removal a rapid thermal anneal, (RTA), procedure is employed to activate the heavily doped source and drain regions. A layer of titanium is next deposited, followed by a rapid thermal anneal, (RTA), procedure, used to form titanium silicide, only on the exposed silicon regions of the CMOS device. The salicide, (Self-ALigned silICIDE), is than established by selective removal of the unreacted titanium from the sides of the dual insulator spacer, using wet chemical etching, followed by the selective removal of the titanium nitride layer, again using wet chemical etching, exposing a peripheral channel region between the polysilicon gate structure and the heavily doped source and drain regions. Photoresist masking is next used to allow processing to occur in the peripheral channel region of NFET devices. First a pocket ion implantation step is performed, to increase the P type doping level of the peripheral channel region, the region between the polysilicon gate structure and the titanium silicide on the heavily doped source and drain regions, thus reducing the effect of subsequent source and drain punchthrough. The same photoresist mask is used to allow the NFET, ultra lightly doped source and drain, (ULDD), region to be formed via another ion implantation step, resulting in lower parasitic junction capacitance of source and drain regions. Finally a ultra shallow, junction extension ion implantation step is performed, in the peripheral channel region, creating a more conductive N type region between the polysilicon gate structure and the titanium silicide, on the NFET, heavily doped source and drain regions. After photoresist removal, another photoresist masking procedure is performed to allow ion implantation processing to be performed in the peripheral channel regions in PFET regions of the CMOS device. Again a pocket ion implantation step, N type, followed by a lightly doped, P type, LDD ion implantation step, and a P type, ultra shallow, ion implantation step, are performed. After photoresist removal another RTA procedure is performed to enhance the conductivity of the titanium silicide, as well as activating the junction extension ion implantation region.

BRIEF DESCRIPTION OF THE DRAWINGS

The object and other advantages of this invention are best described in the preferred embodiment with reference to the attached drawings that include:

FIGS. 1-13, which schematically show the stages of fabrication used to create a CMOS device with a dual insulator spacer, to reduce salicide bridging, an ultra shallow junction extension ion implantation region, to reduce device resistance, and a pocket ion implantation region, to reduce the effect of junction punchthrough.

DESCRIPTION OF THE PREFERRED EMBODIMENTS

Figure 1:
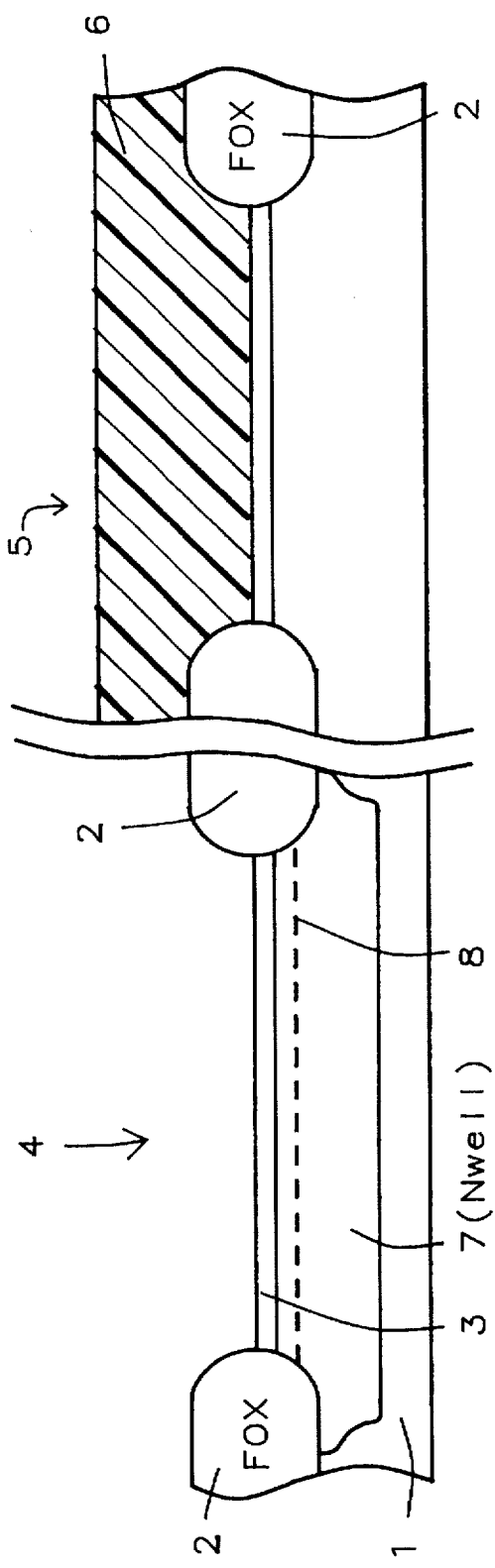

The method of creating a CMOS device, with a sub-quarter micron channel length, using a dual insulator spacer, a pocket ion implantation region, an ultra lightly doped source and drain region, and a ultra shallow, junction extension, ion implantation region, will now be covered in detail. Referring to FIG. 1, a substrate, 1, composed of P type, single crystalline silicon, with a <100> orientation, is used. Field oxide, (FOX), region, 2, is formed for isolation purposes, separating the subsequent P channel region, (PFET), 4, from the subsequent N channel region, (NFET), 5. The FOX region is formed by initially growing a thin layer of silicon dioxide, 3, via thermal oxidation processing, and than depositing a layer of silicon nitride, (not shown in FIG. 1). The silicon nitride is deposited via either low pressure chemical vapor deposition, (LPCVD), or plasma enhanced chemical vapor deposition, (PECVD), processing. Photolithographic and reactive ion etching, (RIE) processing, are used to create a desired pattern in the oxidation resistant, silicon nitride—silicon dioxide layer.

After photoresist removal, via plasma oxygen ashing and careful wet cleans, FOX region, 2, is thermally grown in an oxygen—steam ambient, to create a FOX region, 2, to a thickness between about 3000 to 5000 Angstroms in regions not protected by the silicon nitride—silicon dioxide, oxidation resistant pattern. The silicon nitride layer is than removed in a hot phosphoric acid solution. Another photoresist pattern, 6, is used to blockout NFET region, 5, from an ion implantation of phosphorous, at an energy between about 300 to 800 KeV, at a dose between about 5E12 to 1E13 atoms/cm$^2$, used to create N well region, 7, shown schematically for the PFET region, 4, in FIG. 1. Photoresist pattern, 6, is again used to blockout NFET region, 5, and allow an ion implantation of phosphorous or arsenic, to be performed at an energy between about 25 to 80 KeV, at a dose between about 2E12 to 4E12 atoms/cm$^2$, to create threshold adjust region, 8, for PFET region, 4. Photoresist pattern, 6, is than removed via plasma oxygen ashing and careful wet cleans.

Figure 2:
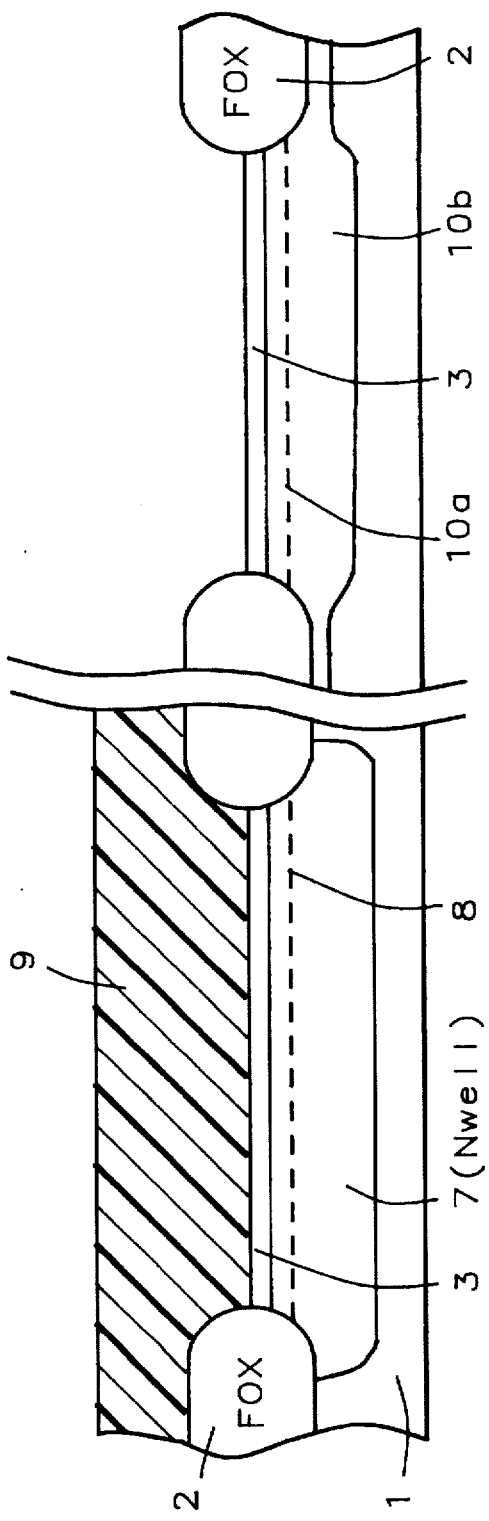

Another photoresist pattern, 9, is used to blockout the PFET regions, 4, from an ion implantation procedure of BF$_2$, at an energy between about 20 to 40 KeV, at a dose between about 2.5E12 to 4E12 atoms/cm$^2$, used to create a threshold voltage adjust region, 10a, shown schematically in FIG. 2. Also shown schematically in FIG. 2, is a P well region, 10b, and channel stop region, 10b, under FOX region, 2, created via ion implantation of boron, at an energy between about 130 to 180 KeV, at a dose between about 5E12 to 7E12 atoms/cm$^2$. Photoresist removal is accomplished via plasma oxygen ashing and careful wet cleans. Silicon dioxide layer, 3, is next removed using a dilute hydrofluoric, (HF), acid solution, consisting of 50 parts H$_2$O, to one part HF. After careful wet cleans, a silicon dioxide, gate insulator, 11, is thermally grown, in an oxygen—steam ambient, at a temperature between about 800° to 1000° C., to a thickness between about 30 to 300 Angstroms. Next the deposition of a polysilicon layer, is performed using LPCVD processing, at a temperature between about 500° to 650° C., to a thickness between about 2000 to 4000 Angstroms. The polysilicon layer, can be grown using insitu doping procedures, via incorporation of arsine or phosphine, to a silane ambient. The polysilicon layer, can also be deposited intrinsically, and doped via ion implantation of arsenic or phosphorous, at an energy between about 30 to 75 KeV, at a dose between about 5E14 to 1E16 atoms/cm$^2$. Photolithographic and RIE processing, using SF$_6$ or Cl$_2$ as an etchant, are used to create polysilicon gate structure, 12, shown schematically in FIG. 3. Polysilicon gate structure, 12, is between about 1000 to 3500 Angstroms in width. Photoresist removal is performed using plasma oxygen ashing, followed by careful wet cleans.

FIG. 4, shows the creation of a dual insulator spacer, created by initially depositing a layer of silicon oxide, 13, via PECVD procedure, at a temperature between about 350° to 450° C., to a thickness between about 100 to 400 Angstroms, using tetraethylorthosilicate, (TEOS), as a source. Next a layer of titanium nitride, (TiN), 14, is deposited via chemical vapor deposition procedures, at a temperature between about 540° to 660° C., to a thickness between about 1000 to 3000 Angstroms. The thickness of the titanium nitride layer will determine the width of a subsequently formed, peripheral channel region. Two consecutive anisotropic, selective RIE procedures, the first using HCL—Cl$_2$, and the second using CHF$_3$ as etchants, are next employed to form the sidewall spacer, shown schematically in FIG. 4. The spacer definition also selectively removes gate insulator, 11, from areas exposed to the RIE procedure, between FOX regions, 2, and polysilicon gate structure, 12.

The creation of heavily doped source and drain regions for both PFET regions, 4, and NFET regions, 5, are next performed and shown schematically in FIGS. 5–6. First a photoresist pattern, 15, is used to block the PFET region, 4, from an arsenic ion implantation procedure, performed at an energy between about 40 to 80 KeV, at a dose between about 3E15 to 5E15 atoms/cm², creating the heavily doped N type source and drain region, 16, shown in FIG. 5. After removal of photoresist pattern, 15, via plasma oxygen ashing and careful wet cleans, another photoresist pattern, 17, is used to block NFET region, 5, from a $BF_2$ ion implantation procedure, performed at an energy between about 35 to 60 KeV, at a dose between about 2E15 to 4E15 atoms/cm², used to create the heavily doped P type source and drain regions, 18, shown schematically in FIG. 6. After removal of photoresist pattern, 17, via plasma oxygen ashing and careful wet cleans, a first rapid thermal anneal, (RTA), procedure is performed at a temperature between about 950° to 1050° C., for a time between about 10 to 30 sec. in a nitrogen ambient, for purposes of activating the heavily doped source and drain implant regions.

Figure 7:
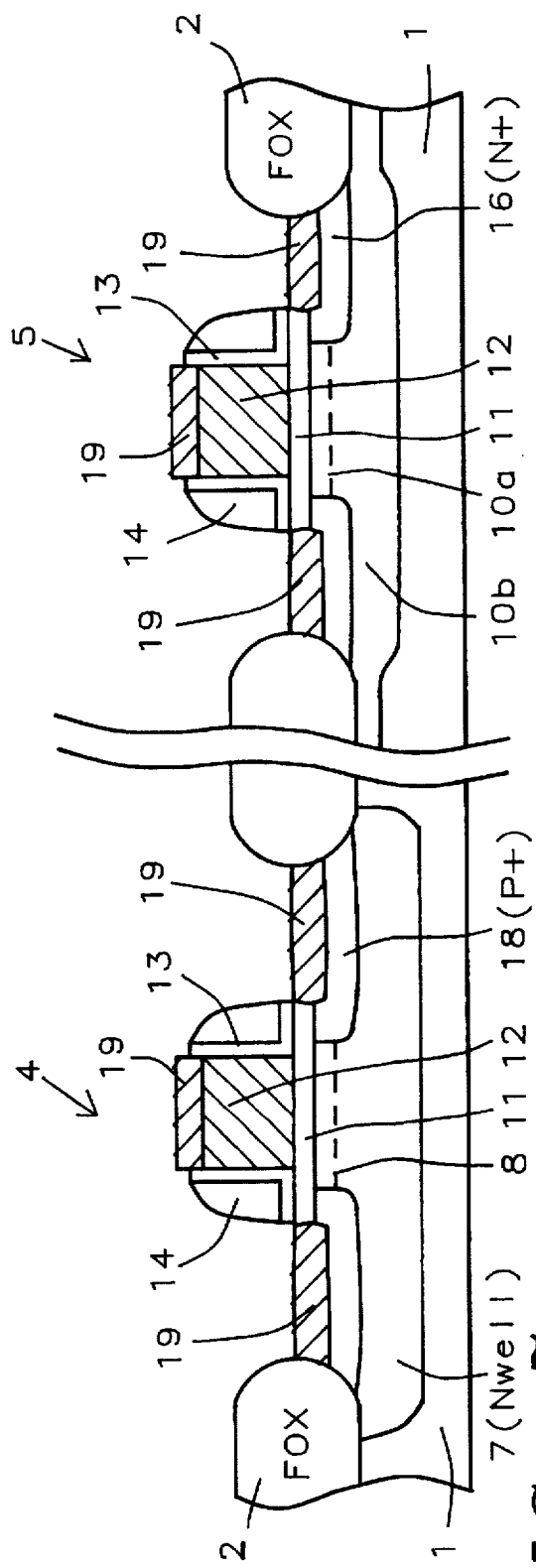
Figure 8:
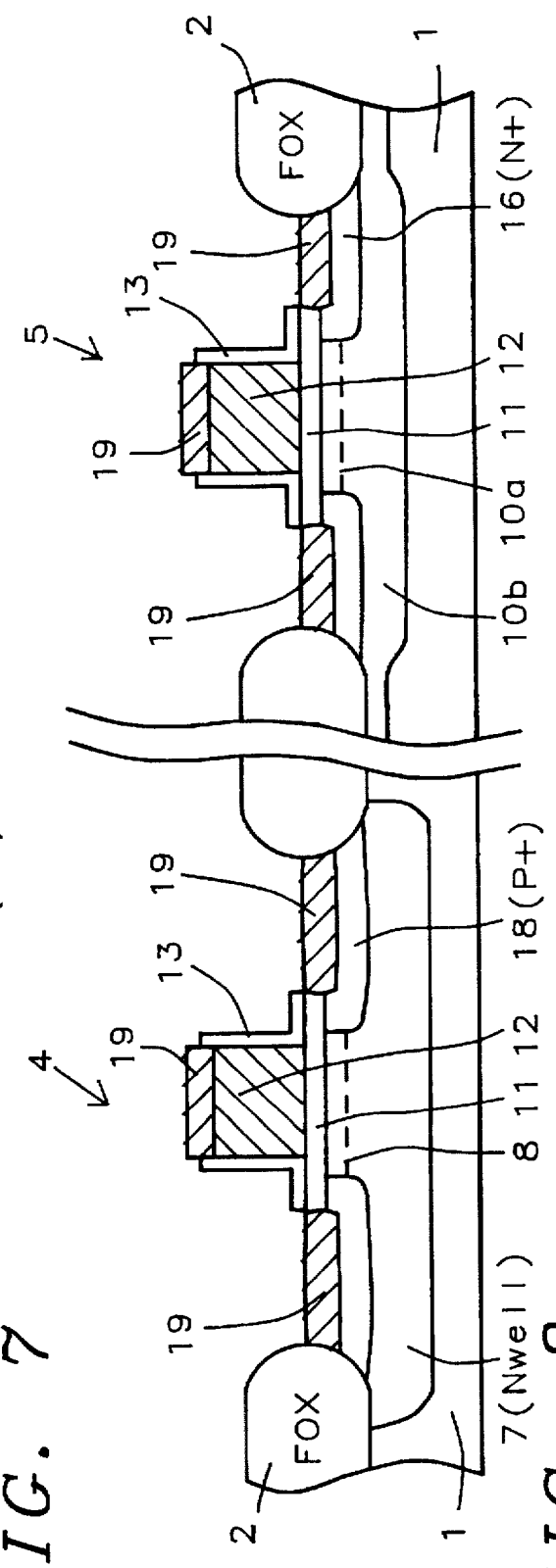

The formation of Self-ALigned silICIDE, (salicide), contacts to the heavily doped source and drain regions, as well as to the polysilicon gate structure, is next addressed. After a preclean in a hydrofluoric acid solution, a layer of titanium is deposited using r.f sputtering procedures, to a thickness between about 300 to 450 Angstroms. A second RTA procedure is performed at a temperature between about 650° to 750° C., for a time between about 10 to 30 sec., in a nitrogen ambient, to form titanium silicide, 19, in regions in which titanium overlaid silicon, such as the heavily doped source and drain areas, as well as the top surface of the polysilicon gate structure. The unreacted titanium, overlying the FOX regions, 2, or on the top layer of the dual insulator spacer, titanium nitride, 14, as well as the top layer of the dual insulator spacer, TiN, 14, are simultaneously removed using a 1:1:1 solution of $NH_4OH$ - $H_2O_2$ - $H_2O$, at a temperature of about 25° C., for a time of about 30 min., leaving titanium silicide, 19, on the heavily doped source and drain regions and on the top surface of the polysilicon gate structure. This is shown schematically in FIG. 7. However in some cases the formation of titanium silicide results in thin ribbons of titanium silicide on the top surface of the dual insulator spacer, bridging the polysilicon gate structure and the heavily doped source and drain regions, resulting in either unwanted leakage or shorts. The bridging phenomena is more prevalent with the narrower channel lengths, due to narrower insulator spacers, and thinner polysilicon gate structures. Therefore to achieve successful sub-quarter micron devices, potential titanium silicide bridging has to be addressed. In this invention the risk of bridging is eliminated via the removal of the top layer of the dual insulator spacer, titanium nitride, 14, during the unreacted titanium removal procedure. The removal of titanium nitride layer, 14, overlying silicon oxide layer, 13, insures the removal of any titanium silicide ribbons, that may have resided on the titanium nitride layer, 14, after the second RTA procedure. The removal of the titanium nitride layer also creates a peripheral channel region, between polysilicon gate structures and heavily doped source and drain regions. This is schematically shown in FIG. 8.

The region between the heavily doped source and drain regions, and the polysilicon gate structure, the peripheral channel region, can now be engineered to provide additional CMOS device yield enhancements, as well as also providing CMOS device performance and reliability enhancements. Another photoresist pattern, 20, is used to block PFET region, 4, from a ion implantation procedure, using boron, at an energy between about 20 to 80 KeV, at a dose between about 5E13 to 1E14 atoms/cm², to create a P type, pocket ion implanted region, 21, for the NFET region, 5, shown schematically in FIG. 9. This region offers a higher P type concentration than exists in substrate, 1, or P well region, 10b, therefore restricting the extent of a depletion region, formed from the N type, heavily doped source and drain regions and the P type substrate, 1, or P well region, 10b. The smaller depletion region reduces the risk of punchthrough, and the level of punchthrough leakage, due to the converging depletion regions, in the narrow channel region of a sub-quarter micron device, thus offering improving yield for the CMOS device.

Again using photoresist pattern, 20, to blockout PFET region, 4, an N type, ultra lightly doped source and drain region, 22, (ULDD), is formed via ion implantation of phosphorous, at an energy between about between about 20 to 30 KeV, at a dose between about 3E11 to 2E12 atoms/cm². This ULDD region reduces the field in the narrow channel region, thus reducing the risk of hot electron carrier injection. This reliability enhancement is schematically shown in FIG. 10. Furthermore the ULDD region also reduces the junction capacitance of the pocket implant region, 21, due to the increase of the depletion width inside the source and drain region. The performance of the sub-quarter micron device is next addressed with yet another ion implantation procedure, in the NFET region, 5, again using photoresist pattern, 20, to protect the PFET region, 4. An N type, ultra shallow, junction extension, 23, is formed via the ion implantation of arsenic, at an energy between about 10 to 25 KeV, at a dose between about 5E14 to 3E15 atoms/cm². The ultra shallow, junction extension, more conductive than ULDD region, 22, lowers the resistance of the NFET device, resulting in performance enhancements. The ultra shallow, junction extension, 23, is schematically shown in FIG. 10. Photoresist pattern, 20, is now removed using plasma oxygen ashing and careful wet cleans.

Similar processing, used to enhance yield, reliability, and performance for the NFET region, 5, is now performed to the PFET region, 4. Another photoresist pattern, 24, is used to blockout the NFET regions, 5, from an ion implantation of phosphorous, at an energy between about 100 to 160 KeV, at a dose between about 5E13 to 1E14 atoms/cm². The N type, pocket ion implanted region, 25, shown schematically in FIG. 11, offers a higher N type concentration than the N level concentration in N well region, 7, thus reducing the risk of punchthrough between the converging depletion regions formed from P type source and drain region, 18, and N well region, 7. Photoresist pattern, 24, is than used to protect the NFET region, 5, from a $BF_2$ ion implantation procedure, performed at an energy between about 20 to 50 KeV, at a dose between about 5E11 to 2E12 atoms/cm². This procedure creates the P type, ultra lightly doped source and drain region, 26, used to reduce hot electron carrier injection in the narrow channel of the PFET device. This is shown schematically in FIG. 12. Finally a P type, ultra shallow, junction extension, 27, used to lower the PFET resistance, is created in the PFET region via an ion implantation of $BF_2$, at an energy between about 10 to 20 KeV, at a dose between about 5E14 to 3E15 atoms/cm², schematically shown in FIG. 12. Photoresist pattern, 24, is removed via use of plasma oxygen ashing and careful wet cleans. A third RTA procedure is performed at a temperature between about 800° to 1000° C., for a time between about 5 to 10 sec., to activate the dopants in the ultra shallow junction extension regions.

Figure 13:
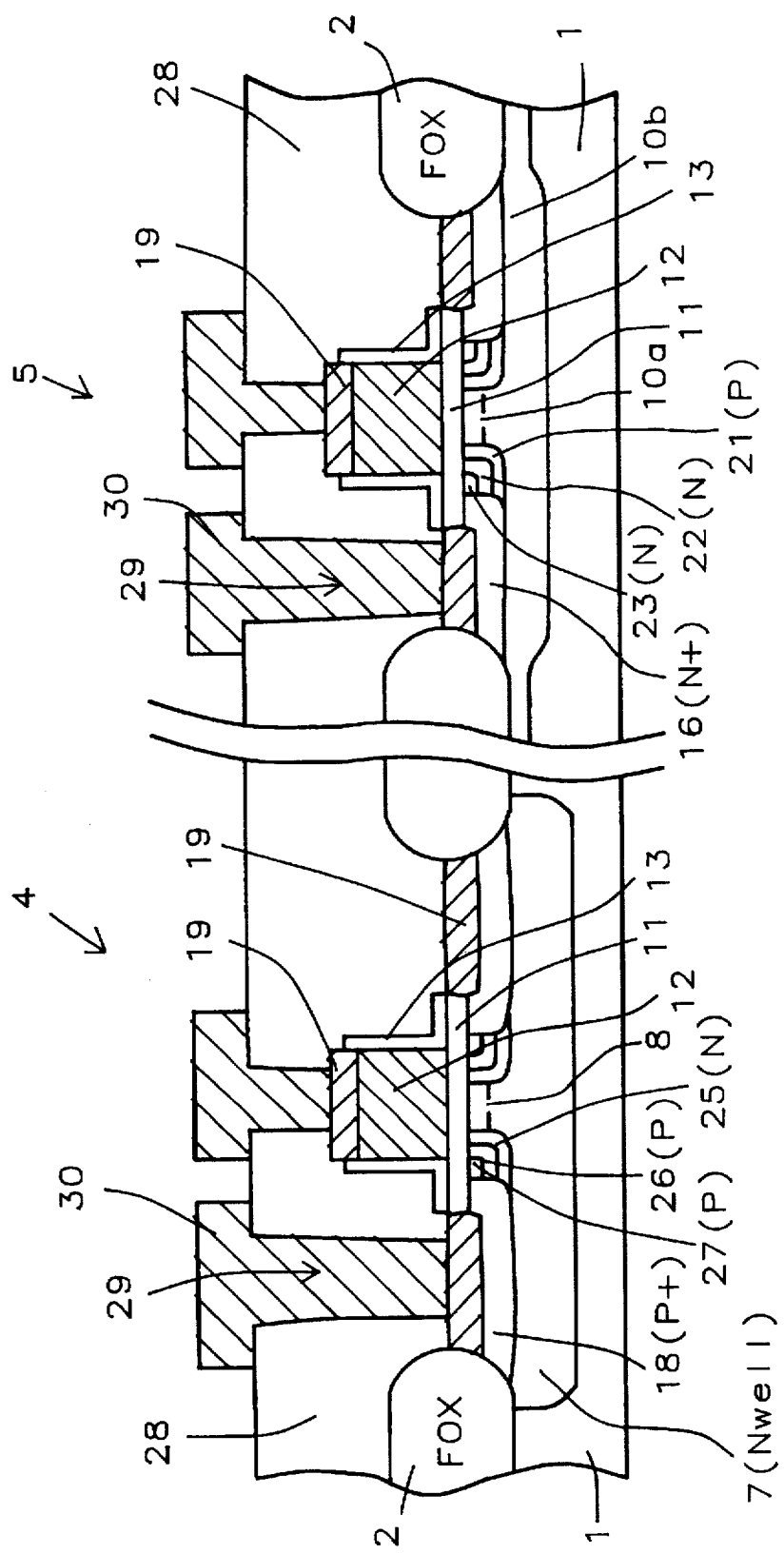

A layer of silicon oxide, 28, is next deposited using LPCVD or PECVD processing, at a temperature between about 400° to 800° C., to a thickness between about 5000 to 15000 Angstroms. Silicon oxide layer 28, is planarized using chemical mechanical polishing procedures. Conventional photolithographic and RIE procedures, using $CHF_3$ as an etchant, are used to create contact hole, 29, shown schematically in FIG. 13. After photoresist removal, via plasma oxygen ashing, followed by careful wet cleans, a layer of titanium, and a layer of titanium nitride, between about 500 to 1500 Angstroms, and between 1000 to 2000 Angstroms, respectfully, are deposited via r.f. sputtering procedures, and followed by a layer of aluminum, containing between about 1 to 3% copper, and between about 0 to 2% silicon, again deposited using r.f. sputtering, to a thickness between about 3000 to 8000 Angstroms. Conventional photolithographic and RIE procedures, using a $Cl_2$ etchant, are used to create metallization structure, 30, consisting of aluminum—titanium nitride—titanium, and shown schematically in FIG. 13. Plasma oxygen ashing, followed by careful wet cleans, are again used to remove photoresist.

This process, used to create CMOS devices, benefitting in terms of yield, performance and reliability, as a result of the dual insulator spacer, the pocket ion implantation region, and the ultra shallow junction extension, although shown for complimentary, (CMOS), devices, can be applied to MOSFET, (metal oxide semiconductor field effect transistors), comprised of only either NFET or PFET devices. This invention can also be applied to BiCMOS, (bipolar—CMOS) devices, as well.

While this invention has been particularly shown and described with reference to the preferred embodiments thereof, it will be understood by those skilled in the art that various changes in form and details may be made without departing from the spirit and scope of this invention.

What is claimed is:

1. A complimentary metal oxide semiconductor,(CMOS) device structure, on a semiconductor substrate, comprising:

field oxide regions in said semiconductor substrate;

a device region between said field oxide regions;

a polysilicon gate structure on said semiconductor substrate, in the center of said device region, with metal silicide on the top surface of said polysilicon gate structure;

an insulator spacer, between about 100 to 400 Angstroms in thickness, comprised of a vertical spacer component, located on the sides of said polysilicon gate structure, and a horizontal spacer component, located on the top surface of said semiconductor substrate, extending between about 1000 to 3000 Angstroms, in length, from the side of said polysilicon gate structure;

a heavily doped source and drain region, located in the surface of said semiconductor substrate, between a field oxide region and said polysilicon gate structure, and underlying said overlying horizontal spacer component, at a point where said horizontal spacer component is between about 500 to 1500 Angstroms from the edge of said polysilicon gate structure;

a metal silicide layer on the region of said heavily source and drain region not covered by said horizontal spacer component;

a space in said semiconductor substrate, between region of said heavily doped source and drain region, located under said horizontal spacer component, and the edge of said polysilicon gate structure, used for a peripheral channel region;

a pocket ion implanted region, opposite in conductivity type to said heavily doped source and drain region, in said peripheral channel region, to a depth between the top surface of said semiconductor substrate, and the bottom of said heavily doped source and drain region;

an ultra lightly doped source and drain region, the same conductivity type as said heavily doped source and drain region, in said peripheral channel region, to a depth of about one half the depth of said pocket ion implanted region;

an ultra shallow junction extension region, in said peripheral channel region, to a depth of about one half the depth of said ultra lightly doped source and drain region, with same conductivity type as said ultra lightly doped source and drain region;

an insulator layer on the top surface of said semiconductor substrate, including said insulator layer on said polysilicon gate structure, on said metal silicide on said heavily doped source and drain region;

contact holes, in said insulator layer, to said metal silicide on said heavily doped source and drain regions, and to said metal silicide on said polysilicon gate structure; and an metal interconnect structure, contacting said heavily doped source and drain region, and said polysilicon gate structure, in said contact hole.

2. The CMOS device structure of claim 1, wherein said polysilicon gate structure is between about 1000 to 3500 Angstroms in width.

3. The CMOS device structure of claim 1, wherein said peripheral channel region is between about 500 to 2000 Angstroms in width.

4. The CMOS device structure of claim 1, wherein said pocket ion implanted region is a P type region, used for the N channel, (NFET), metal oxide semiconductor device, of said CMOS device structure, with a depth between about 1000 to 2000 Angstroms.

5. The CMOS device structure of claim 1, wherein said pocket ion implanted region is an N type region, used for the P channel, (PFET), metal oxide semiconductor device, of said CMOS device structure, with a depth between about 1000 to 2000 Angstroms.

6. The CMOS device structure of claim 1, wherein said ultra shallow junction extension is a heavily doped N type region, used for the NFET region of said CMOS device structure, with a depth between about 500 to 1000 Angstroms.

7. The CMOS device structure of claim 1, wherein said ultra shallow junction extension is a heavily doped P type region, used for the PFET region of said CMOS device structure, with a depth between about 500 to 1000 Angstroms.

* * * * *